US009011973B2

(12) United States Patent
Chu et al.

(10) Patent No.: US 9,011,973 B2
(45) Date of Patent: Apr. 21, 2015

(54) METHODS FOR DEPOSITING OXYGEN DEFICIENT METAL FILMS

(71) Applicant: Applied Materials, Inc., Santa Clara, CA (US)

(72) Inventors: Schubert Chu, San Francisco, CA (US); Er-Xuan Ping, Fremont, CA (US); Yoshihide Senzaki, Aptos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/934,486

(22) Filed: Jul. 3, 2013

(65) Prior Publication Data

US 2014/0017403 A1 Jan. 16, 2014

Related U.S. Application Data

(60) Provisional application No. 61/670,873, filed on Jul. 12, 2012.

(51) Int. Cl.
*C23C 16/40* (2006.01)
*C23C 16/06* (2006.01)
*C23C 16/455* (2006.01)
*C23C 28/00* (2006.01)

(52) U.S. Cl.
CPC ............ *C23C 16/06* (2013.01); *C23C 16/40* (2013.01); *C23C 16/45529* (2013.01); *C23C 28/00* (2013.01)

(58) Field of Classification Search
USPC .................... 427/255.31, 255.32, 255.394
See application file for complete search history.

(56) References Cited

U.S. PATENT DOCUMENTS

| | | | |
|---|---|---|---|
| 5,185,182 A | * | 2/1993 | Brown ................. 427/126.2 |
| 5,186,718 A | | 2/1993 | Tepman et al. |
| 7,791,119 B2 | | 9/2010 | Odagawa et al. |

(Continued)

FOREIGN PATENT DOCUMENTS

| | | |
|---|---|---|
| JP | 2007-28808 | 11/2007 |
| WO | WO-2010/004705 | 1/2010 |
| WO | WO-2012/001993 | 1/2012 |

OTHER PUBLICATIONS

Cho, Deok-Yong, et al., "Bond nature of oxygen-deficient HfO2/Si(100) film." Applied Physics Letters, 89, 253510 (2006), pp. 1-3.*

(Continued)

*Primary Examiner* — Bret Chen
(74) *Attorney, Agent, or Firm* — Servilla Whitney LLC

(57) ABSTRACT

Methods of depositing an oxygen deficient metal film by chemical reaction of at least one precursor having a predetermined oxygen deficiency on a substrate. An exemplary method includes, during a metal oxide deposition cycle, exposing the substrate to a metal reactant gas comprising a metal and an oxygen reactant gas comprising oxygen to form a layer containing a metal oxide on the substrate. During an oxygen deficient deposition cycle, exposing the substrate to a metal reactant gas comprising a metal and an additional reactant gas excluding oxygen to form a second layer at least one of a metal nitride and a mixed metal on the substrate during a second cycle, the second layer being oxygen deficient relative to the layer containing the metal oxide; and repeating the metal oxide deposition cycle and the oxygen deficient deposition cycle to form the oxygen deficient film having the predetermined oxygen deficiency.

16 Claims, 1 Drawing Sheet

(56) References Cited

U.S. PATENT DOCUMENTS

| | | | |
|---|---|---|---|
| 8,043,926 | B2 | 10/2011 | Cho et al. |
| 8,264,865 | B2 | 9/2012 | Mitani et al. |
| 2005/0051828 | A1* | 3/2005 | Park et al. .................... 257/310 |
| 2006/0046521 | A1* | 3/2006 | Vaartstra et al. ............. 438/778 |
| 2007/0116887 | A1* | 5/2007 | Faguet ......................... 427/569 |
| 2009/0155606 | A1* | 6/2009 | Yoon et al. ................... 428/446 |
| 2010/0013372 | A1* | 1/2010 | Oikawa et al. ............... 313/498 |
| 2010/0072611 | A1* | 3/2010 | Oikawa et al. ............... 257/702 |
| 2010/0109098 | A1* | 5/2010 | Lin et al. ...................... 257/411 |
| 2011/0217564 | A1* | 9/2011 | Neogi et al. .................. 428/553 |
| 2011/0263115 | A1* | 10/2011 | Ganguli et al. .............. 438/595 |
| 2012/0193600 | A1 | 8/2012 | Himeno et al. |

OTHER PUBLICATIONS

Perez-Casero, R., et al., "Thin films of oxygen-deficient perovskite phases by pulsed-laser ablation of strontium titanate". Physical Review B 75, 165317 (2007), pp. 1-7.*

Chen, Jian-Xiong, et al., "Performance Improvements of Metal-Oxide-Nitride-Oxide-Silicon Nonvolatile Memory with ZrO2 Charge-Trapping by Using Nitrogen Incorporation." Applied Physics Express 6 (2013) 084202, pp. 1-4.*

Kim, Kyoung H., et al., "Atomic layer deposition of insulating nitride interfacial layers for germanium metal oxide semiconductor field effect transistors with high-k oxide/tungsten nitride gate stacks". Applied Physics Letters 90, 212104 (2007), pp. 1-3.*

An, Ho-Myoung, et al., "Improved Electrical and Reliability Characteristics in Metal/Oxide/Nitride/Oxide/Silicon Capacitors with Blocking Oxide Layers Formed Under the Radical Oxidation Process". Journal of Nanoscience and Nanotechnology, vol. 10, No. 7, 4701-4705, 2010.*

Kim, Sook J. et al., "Characteristics and the Model of Resistive Random Access Memory Swithcing of the Ti/TIO$_2$ Resistive Material Depending on the Thickness of Ti", *Japanese Journal of Applied Physics* vol. 50 (2011), pp. 04DD14-1 to 04DD14-4.

PCT International Search Report & Written Opinion in PCT/US2013/049663, mailed Oct. 1, 2013, 13 pgs.

PCT International Preliminary Report on Patentability in PCT/US2013/049663, dated Jan. 22, 2015, 9 pages.

* cited by examiner

METHODS FOR DEPOSITING OXYGEN DEFICIENT METAL FILMS

CROSS-REFERENCE TO RELATED APPLICATIONS

This application claims priority to U.S. Provisional Application No. 61/670,873, filed Jul. 12, 2012, the entire contents of which are hereby incorporated by reference.

TECHNICAL FIELD

Aspects of the present invention relates to methods for depositing of oxygen deficient metal films.

BACKGROUND

Deposition of thin films on a substrate surface is an important process in a variety of industries, including semiconductor processing, diffusion barrier coatings, dielectrics for magnetic read/write heads, and random access memory. In contrast to volatile types of memory, such as DRAM memory modules, resistive random access memory ("ReRAM" or "RRAM") has gained much interest as one of the possible candidates of future non-volatile memory devices which can replace conventional flash memory because of its simple structure, long retention time, high switching speed, and high scalability. Metal oxide films incorporating transition metals are used in semiconductor applications including high K gate dielectric films, active materials for ferroelectric memories, thin film battery cathodes, materials in silicon based light emitting devices and memory cells. RRAM is an emerging memory type that relies on oxygen filaments in the metal oxide film to modulate the resistance of the memory cell. Oxygen deficient metal oxides are desirable for the operation of the RRAM cell. However, the ability to control the specific composition of the metal oxide deposited layer can be limited. Many metal-oxygen condensed phase systems employ metal oxides that are known to be stable at different oxidation potentials and have well-defined stoichiometric phases. For these materials it is generally possible to consistently obtain a desired metal oxide once an oxidation potential threshold is exceeded, and equilibrium is reached. However, for applications in which metal oxide films deficient in oxygen are desired, processes such as "scavenging" or "gettering" to absorb some of the oxygen have been employed once the stoichiometric deposition has occurred by physical vapor deposition (PVD) or chemical vapor deposition (CVD).

PVD has the limitation of being a non-conformal deposition method and has issues for extendibility to three-dimensional memory architectures. With atomic layer deposition (ALD), a variation of CVD, it has been virtually impossible to deposit oxygen deficient metal oxide films because ALD is a self-limiting, saturated process by definition. There is therefore a need for CVD and ALD processes in which oxygen levels can be better controlled to produce transition metal oxide thin films on substrate surfaces which have oxygen deficient compositions. This need is particularly acute in the field of deposition of nonstoichiometric metal oxides, such as transition metal oxides.

In RRAM, oxygen vacancies are needed to carry electrical charge through the dielectric layer to conduct electric signal between the top and bottom electrodes. Therefore it is desirable to be able to control the metal to oxygen ratio (M:O) in metal oxides $MO_x$.

SUMMARY

One aspect of the invention relates to a method of depositing an oxygen deficient metal composite film comprising at least two layers by chemical reaction of at least one precursor having a predetermined oxygen deficiency on a substrate, the method comprising: during a metal oxide deposition cycle, exposing the substrate to a metal reactant gas comprising a metal and an oxygen reactant gas comprising oxygen to form a layer containing a metal oxide; during an oxygen deficient deposition cycle, exposing the substrate to a reactant gas comprising a metal reactant gas and optionally a reactant gas excluding oxygen to form a an oxygen deficient layer selected from one or more of a metal, a metal nitride, a metal carbonitride, a metal carbide, a metal oxynitride, a metal oxycarbonitride, a metal silicide, a nitrided metalsilicide (MSiN), a metal silicate, a nitride metal silicate (MSiON)) and combinations thereof, the oxygen deficient layer being oxygen deficient relative to the layer containing the metal oxide; and repeating the metal oxide deposition cycle and the oxygen deficient deposition cycle to form the oxygen deficient film having the predetermined oxygen deficiency; wherein said method of deposition is selected from chemical vapor deposition and atomic layer deposition or a combination thereof.

A second aspect of the invention relates to a method of depositing an oxygen deficient metal film having a predetermined oxygen deficiency on a substrate, the method comprising: (a) disposing a substrate within a processing chamber; (b) performing a deposition process comprising: (i) flowing $HfCl_4$ gas to at least a portion of the substrate within the chamber under conditions which form a partial monolayer on the substrate, the partial monolayer comprising Hafnium terminated with chlorine, (ii) flowing a purge gas, (iii) flowing water vapor to the substrate within the chamber under conditions which form a partial monolayer on the substrate, the partial monolayer comprising hafnium oxide and (iv) flowing a purge gas; (c) performing a second deposition process comprising: (i) flowing $HfCl_4$ gas to at least a portion of the substrate within the chamber under conditions which form a partial monolayer comprising hafnium terminated with chlorine, (ii) flowing a purge gas, (iii) flowing $NH_3$ to the substrate within the chamber under conditions to form a partial monolayer comprising HfN, and (iv) flowing a purge gas; and (d) repeating (b) and (c); wherein the deposition process is selected from chemical vapor deposition and atomic layer deposition or combinations thereof.

A third aspect of the invention relates to a method of depositing an oxygen deficient metal film having a predetermined oxygen deficiency on a substrate, wherein the substrate comprises TiN. The method comprises performing a first deposition process comprising: (i) flowing a Hf precursor to at least a portion of the substrate within the chamber under conditions which form a partial monolayer on the substrate, the partial monolayer comprising hafnium, flowing a purge gas, performing a second deposition process comprising: flowing a Hf precursor to at least a portion of the substrate within the chamber under conditions which form a partial monolayer comprising hafnium, flowing a purge gas, flowing water vapor to the substrate within the chamber under conditions which form a partial monolayer on the substrate, the partial monolayer comprising hafnium oxide and flowing a purge gas; and repeating the process, wherein the deposition process is selected from chemical vapor deposition and atomic layer deposition or combinations thereof.

DETAILED DESCRIPTION

Figure 2:
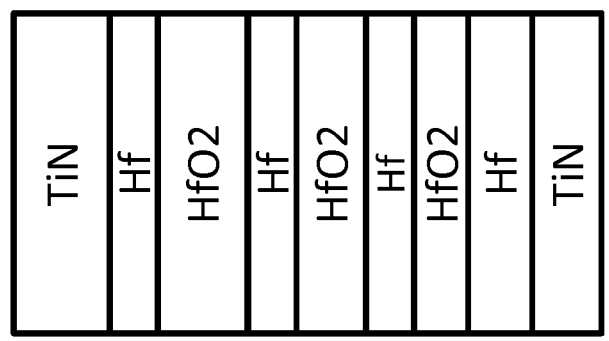
FIG. 2 shows an alternative embodiment of a composite film stack.

Before describing several exemplary embodiments of the invention, it is to be understood that the invention is not limited to the details of construction or process steps set forth in the following description. The invention is capable of other embodiments and of being practiced or being carried out in various ways.

In the semiconductor industry, in particular, miniaturization requires atomic level control of thin film deposition to produce conformal coatings on high aspect structures. One method for deposition of thin films is chemical vapor deposition (CVD) in which a gas phase chemical precursor molecule and a reactant gas are reacted on and/or above a temperature-controlled surface to form a thin film. The reactive species, energy, rate of chemical supply, substrate temperature and substrate itself contribute to determining the properties of the film. In a typical CVD process, the reactants are introduced into the reactor in gas phase and activated by heat, plasma or other means. The reactive species are then adsorbed onto the substrate surface, where they may undergo chemical reactions or react with other incoming species to form a solid film. Reaction by-products are desorbed from the substrate surface and removed or purged from the reactor.

A variation of chemical vapor deposition for deposition of thin films is atomic layer deposition (ALD), which employs sequential, self-limiting surface reactions to form layers of precise thickness controlled at the Angstrom or monolayer level. Most ALD processes are based on binary reaction sequences which deposit a binary compound film. Each of the two surface reactions occurs sequentially, and because they are self-limiting, a thin film can be deposited with atomic level control. Because the surface reactions are sequential, the two gas phase reactants are not in contact and possible gas phase reactions that may form and deposit particles are limited. The self-limiting nature of the surface reactions also allows the reaction to be driven to completion during every reaction cycle, resulting in films that are continuous and pinhole-free.

As used in this specification and the appended claims, the term "purge" is used to mean any process in which the contents of a system are removed. Purging can mean that the contents (e.g., a gaseous reactant) are removed by being replaced with another gas (e.g., an inert gas) or removed by introducing a vacuum (or partial vacuum) to the system.

According to one or more embodiments, the invention relates to a method of depositing an oxygen deficient metal film by chemical reaction. The methods, also referred to as processes, include sequentially exposing a substrate, or portion of a substrate, to various deposition gases containing chemical precursors or reactants including a metal reactant gas, an oxygen reactant gas, a metal reactant gas and an additional reactant gas. Between the exposures, a purge gas can be flowed. In one cycle, the metal reactant gas and oxygen reactant gas form at least a partial layer of metal oxide on the substrate during a first deposition process. In another cycle, the substrate is also exposed, sequentially, to a metal reactant gas and an additional reactant gas. The metal reactant gas and additional reactant gases form at least a partial layer of metal nitride on the substrate during a second deposition process.

The first and the second deposition processes are repeated sequentially to form a mixed metal oxide/metal nitride or mixed metal film having a desired thickness. Skilled artisans will understand that the first deposition process can be repeated multiple times before the second deposition process, and that the second deposition process can be repeated multiple times before the first deposition process, and that either process can be performed first.

According to one or more embodiments, by varying the ratio of the metal oxide layer and the metal nitride layer thickness or number of layers, the oxygen content of the film can be controlled. For example, multiple metal nitride layers can be deposited in a ratio to the metal oxide layer of 2:1, 3:1, 4:1, 5:1, 10:1, 15:1, and 20:1 or higher to provide a greater amount of metal nitride layer than metal oxide, thereby tuning the oxygen content of the overall film formed by the process described herein.

In a specific embodiment, the metal reactant gas used in both cycles can include any suitable metal-containing gas known to the skilled artisan. The metals can be the same or different in each of the cycles. Suitable metal species include Hf, Sr, Ni, Ti, Al, Zr, Cu, In—Zn, and PrCaMnO. In another embodiment suitable metal species include SrTi, Cr—SrZr, PrCaMn, SrLaTi, LaSrFe, LaSrCo, and (Ba,Sr)Ti. In specific embodiments, the substrate is exposed to an oxygen reactant gas comprising an oxygen species or an oxidant. Suitable oxidants include, but are not limited to, $H_2O$, $H_2O_2$, $O_2$, $O_3$, $N_2O$, NO, NOx, nitrates, alcohols, carboxylic acids, CO, $CO_2$, and HCOH. Specifically, in some embodiments, the oxidant comprises water. The substrate is also exposed to an additional reactant gas excluding or deficient in oxygen. In specific embodiments, the suitable oxygen deficient gas can include nitrogen, ammonia, an alane, aluminum hydrocarbons, and the like. In a specific embodiment, the additional reactant gas comprises one of alane, trimethyl aluminum, triethyl aluminum, dimethyl aluminum hydride, dimethylethylamine alane, triethylamine alane, trimethylamine alane and methylpyrrolidine alane. In a specific embodiment, the methods of the invention form a layer containing a metal oxide on the substrate during a metal oxide deposition cycle and form an oxygen deficient layer of at least one of a metal nitride and a mixed metal on the substrate during a second cycle, the oxygen deficient layer being oxygen deficient relative to the layer containing the metal oxide. Specifically, the methods include repeating the metal oxide deposition cycle and the oxygen deficient deposition cycle to form the oxygen deficient film having the predetermined oxygen deficiency.

A list of suitable metal oxide films contemplated by the invention includes but is not limited to: $HfO_2$, $Al_2O_3$, $ZrO_2$, $TiO_2$, NiO, $Cu:MnO_x$, $Cu_xO$, $Cu:MoO_x$, In—Zn—O, $SrTiO_3$, Cr—$SrZrO_3$, $PrCaMnO_3$, $SrLaTiO_3$, $LaSrFeO_3$, $LaSrCoO_3$, and $(Ba,Sr)TiO_3$.

[OTHERS?]

A list of suitable oxygen deficient metal films contemplated by the invention includes but is not limited to: HfN, HfTiO, HfAl, NiN, TiN, PCMO, $Al_2O$, ZrO, TiO, Cu:MnO, $Cu_xN$, Cu:MoO, In—Zn—N, SrTiO, Cr—SrZrO, PrCaMnO, SrLaTiO, LaSrFeO, LaSrCoO, and (Ba,Sr)TiO.

In detailed embodiments, a list of composite films contemplated by the invention includes but is not limited to: $HfO_2$/HfN, $HfO_2$/HfTiO, $HfO_2$/HfAl, $Al_2O_3$/$Al_2O$, $ZrO_2$/ZrO, $TiO_2$/TiO, NiO/NiN, $Cu:MnO_x$/Cu:MnO, $Cu_xO$/$Cu_xN$, $Cu:MoO_x$/Cu:MoO, In—Zn—O/In—Zn—N, $SrTiO_3$/SrTiO, Cr—$SrZrO_3$/Cr—SrZrO, $PrCaMnO_3$/PrCaMnO, $SrLaTiO_3$/SrLaTiO, $LaSrFeO_3$/LaSrFeO, $LaSrCoO_3$/LaSrCoO, $(Ba,Sr)TiO_3$/(Ba,Sr)TiO, HFO2/TiN, and combinations thereof.

In specific embodiments, the method comprises, disposing a substrate within a processing chamber and forming a layer on the substrate, for example a TiN layer. Subsequently, an oxygen deficient deposition cycle is performed, comprising flowing $HfCl_4$ gas to at least a portion of the substrate within the chamber under conditions which form a partial monolayer comprising hafnium terminated with chlorine, followed by flowing a purge gas into the chamber. This may be followed with flowing $NH_3$ to the substrate within the chamber under conditions to form a partial monolayer comprising HfN followed by flowing a purge gas. Alternatively, only the $HfCl_4$ gas is flowed during the oxygen deficient deposition cycle to form an oxygen deficient layer on the TiN layer. Then, a metal oxide deposition cycle is performed, comprising flowing $HfCl_4$ gas to at least a portion of the substrate within the chamber under conditions which form a partial monolayer on the substrate, the partial monolayer comprising hafnium terminated with chlorine, followed by flowing a purge gas into the chamber. Then, water vapor may be flowed to the substrate within the chamber under conditions which form a partial monolayer on the substrate; the partial monolayer comprising hafnium oxide on the Hf layer, followed by flowing a purge gas into the chamber.

This can then be followed by performing a second deposition process comprising, flowing $HfCl_4$ gas to at least a portion of the substrate within the chamber under conditions which form a partial monolayer comprising hafnium terminated with chlorine, followed by flowing a purge gas into the chamber. This may be followed with flowing $NH_3$ to the substrate within the chamber under conditions to form a partial monolayer comprising HfN followed by flowing a purge gas. The first and second depositions are then repeated until the desired thickness of the oxygen deficient metal film is reached.

During the purge, typically an inert gas is introduced into the processing chamber to purge the reaction zone or otherwise remove any residual reactive compound or by-products from the reaction zone. Alternatively, the purge gas may flow continuously throughout the deposition process so that only the purge gas flows during a time delay between disposure of the reactant gases.

Figure 1:
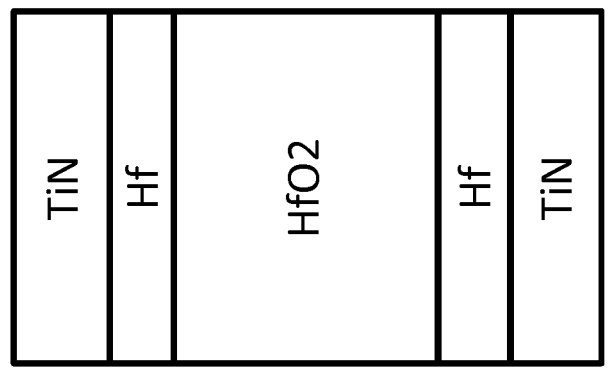
FIG. 1 shows an exemplary embodiment of a composite film stack.

FIGS. 1 and 2 show exemplary embodiments of composite film stacks that can be formed according to embodiments of the invention. The embodiments shown in FIGS. 1 and 2 are not limiting, and many other configurations can be provided according to alternative embodiments. In FIGS. 1 and 2, examples of film stacks are shown using TiN and Hf-containing layers. In FIG. 1, a TiN layer is formed on a substrate, and an oxygen deficient deposition cycle forms a Hf-containing layer on the TiN layer. Then, an metal oxide deposition cycle forms a $HfO_2$ layer on the Hf layer. Thereafter, another Hf-containing layer is formed in the composite film stack with a oxygen deficient deposition cycle. A TiN layer is then formed on the composite film stack. FIG. 2 shows a variant of film stack with a TiN layer having alternativing layers of Hf-containing layer and $HfO_2$ respectively formed during oxygen deficient deposition cycles and oxygen-containing deposition cycles. The film stack is completed in Figure with a TiN layer.

It should be noted that the Hf-containing layer i.e. "oxygen absorber" does not need to be deposited via a reaction between $HfCl_4$ and reactant gas such as $NH_3$ to form HfN. In some embodiments, it can be simply formed by thermal decomposition of Hf precursor (one or more Hf precursor pulses only) under vacuum or under an inert atmosphere (with $N_2$ purge gas). For thermal decomposition, metal-organic (MO) precursors as listed in Claim 8 could be more suitable as compared to $HfCl_4$ because $HfCl_4$ has high thermal stability and does not decompose at a typical ALD process temperature range of 250-300° C. Thermal decomposition of MO source typically results in formation of "$Hf(C)_x(N)_y(O)_z$" (i.e. oxygen deficient) films depending on the precursor used.

In RRAM, oxygen vacancy is needed to carry electrical charge through the dielectric layer to conduct electric signal between the top and bottom electrodes. Typically, the RRAM cell may consist of a TiN bottom electrode, a $HfO_2$ or $MO_x$ high k layer and a TiN top electrode. Specific embodiments of the invention are directed to methods of controlling or tuning the oxygen vacancy or levels in the $MO_x$ layer and minimizing the oxidation of the bottom and top electrodes. Specifically, the invention is directed to methods of obtaining composite films having a predetermined oxygen deficiency on a substrate. In one embodiment, a metal precursor or Hf precursor is pulsed for one or more cycles into a chamber containing a TiN bottom electrode. Followed by flowing a purge gas. Typical Hf precursors can be for example $Hf_2$, $HfCl_4$ and the like. Thermal decomposition of the Hf precursor results in a thin layer of an Hf containing film in contact with the TiN bottom electrode. Hf containing films can be for example, Hf metal, HfC, HfN, HfCN, HfCNO, Hf(Cl) and the like. In another embodiment, the Hf precursor can be HfLn, wherein Ln represents ligands, including but not limited to amide, alkyl, hydride, halide (e.g. Cl, Br, F), amidinate, guanidinate, cyclopentadienyl, betadiketonate, ketoiminate. In one embodiment the Hf precursor is pulsed for one or more pulse/purge cycles until the desired thickness of the Hf containing film is reached. A subsequent deposition process, e.g. an atomic layer deposition or cycle, is performed by flowing a Hf precursor such as, $HfCl_4$ gas to at least a portion of the bottom electrode within the chamber under conditions which form a partial monolayer on the electrode, the partial monolayer comprising hafnium terminated with chlorine, followed by flowing a purge gas into the chamber. Then, water vapor may be flowed to the substrate within the chamber under conditions which form a partial monolayer on the substrate; the partial monolayer comprising hafnium oxide, followed by flowing a purge gas into the chamber. It should be understood that a variety of metal precursors can be flowed to at least a portion of the bottom electrode within the chamber, followed by the flowing of an oxidant, such as water vapor to provide the required metal oxide high k layer. And it should be understood that the deposition process may be repeated one, two or more times until the desired layer number or thickness of the metal oxide high k layer is reached. Then the Hf or metal precursor is flowed for one or more pulse/purge cycles followed by the deposition of the top TiN electrode.

In one embodiment, the deposition of the Hf or metal containing layer is inserted before and after the $HfO_2$ or metal oxide high k layer. In another embodiment the Hf or metal containing layer is inserted between subsequent $HfO_2$ or metal oxide high k layers. For example, alternating layers of Hf containing layers/$HfO_2$ layers can be deposited. In another example the Hf containing layer can be deposited after every 2 cycles of $HfO_2$ deposition, after every 3 cycles, after every 4 cycles, after every 5 cycles up to every 10 $HfO_2$ deposition cycles depending on the desired ration of alternate layers, i.e. ratio of Hf/$HfO_2$ can be for example in a range of from 1:2 to about 1:20 or from about 2:1 to about 20:1. Specifically the range of Hf/$HfO_2$ can be for example from about 1:5 to about 1:10. While not wishing to be bound by theory, by inserting metal or oxygen deficient layers alternating with layers of metal oxide high k layers and managing the number as well as the thickness of each such layer, one can fine tune or control the oxygen vacancy thereby increasing the RRAM capacity as well as minimize the oxidation of the bottom and top electrodes. In one aspect of the invention, the Hf or metal containing oxygen deficient layer functions as an "oxygen absorber" against the $HfO_2$ or metal oxide high k layer therefore generating oxygen vacancy in the metal oxide layer.

In one embodiment of the invention, the Hf or metal precursors can be the same for both the Hf or metal oxygen deficient layer deposition cycle as well as the $HfO_2$ or metal oxide deposition cycle. Suitable precursors for use in both metal and metal oxide deposition cycles include but are not limited to a metal halide, metal nitride, boride, sulfide, silicide and pure metal.

In another embodiment the Hf or metal precursors can be different for each individual deposition cycle. In one embodiment of the invention, the methods are carried out sequentially, in situ, without exposing the substrates to air. In another embodiment, each of the bottom and top electrodes, the metal or oxygen deficient layer and the metal oxide layer can be grown starting with the same precursor. Suitable precursors useful for the growth of all three components, i.e. the bottom/top electrodes, the metal layer, and the metal oxide layer, include but are not limited to $Ti(NR_2)_4$.

Generally, in one or more embodiments, any of the layers described herein may be deposited by methods including, but not limited to ALD, CVD, pulsed, CVD, spray pyrolysis and PVD. Specific embodiments of the invention are directed to methods of obtaining oxygen deficient composite films having a predetermined oxygen deficiency on a substrate. In particular, composite films such as $HfO_2$/HfN and $HfO_2$/HfTiO and $HfO_2$/HfAl are prepared by vapor deposition such as CVD, PVD, ALD or plasma-enhanced CVD (PE-CVD) and plasma-enhanced ALD (PE-ALD). A processing chamber is configured to expose the substrate to a sequence of gases and/or plasmas during the deposition process.

In some embodiments, the substrate is exposed to a metal reactant gas and an oxygen reactant gas. The exposure to these first and second gases can be substantially simultaneously, as in a CVD reaction, or sequentially, as in an ALD reaction. As used in this specification and the appended claims, the term "substantially simultaneously" means that the two precursor gases are flowed into the chamber to react with each other and the substrate surface together. It will be understood by those skilled in the art that there may be areas of the substrate which are briefly exposed to one precursor only until the other precursor diffuses to the same area.

In atomic layer deposition type chambers, the substrate can be exposed to the first and oxygen reactant gases either spatially or temporally separated processes. Temporal ALD is a traditional process in which the metal reactant gas flows into the chamber to react with the surface. The metal reactant gas is purged from the chamber before flowing the oxygen reactant gas. In spatial ALD, both the first and oxygen reactant gases are simultaneously flowed to the chamber but are separated spatially so that there is a region between the flows that prevents mixing of the gases. In spatial ALD, the substrate must be moved relative to the gas distribution plate, or vice-versa.

The ALD process provides that the processing chamber or the deposition chamber may be pressurized at a pressure within a range from about 0.01 Torr to about 80 Torr, for example from about 0.1 Torr to about 10 Torr, and more specifically, from about 0.5 Torr to about 2 Torr. Also, according to one or more embodiments, the chamber or the substrate may be heated to a temperature of less than about 600° C., for example, about 400° C. or less, such as within a range from about 200° C. to about 400° C., and in other embodiments less than about 300° C., less than about 200° C., or less than about 100° C., for example in the range of about 50° C. and 100° C., such as in the range of about 70° C. and 90° C. As will be understood by those skilled in the art, ALD reactions at low temperatures may benefit from the presence of a catalyst. Suitable catalysts include, but are not limited to, ammonia, pyridine and Lewis bases.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not required. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments," "an embodiment," "one aspect," "certain aspects," "one or more embodiments" and "an aspect" means that a particular feature, structure, material, or characteristic described in connection with the embodiment is included in at least one embodiment of the invention. Thus, the appearances of the phrases such as "in one or more embodiments," "in certain embodiments," "in one embodiment," "in an embodiment," "according to one or more aspects," "in an aspect," etc., in various places throughout this specification are not necessarily referring to the same embodiment or aspect of the invention. Furthermore, the particular features, structures, materials, or characteristics may be combined in any suitable manner in one or more embodiments or aspects. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method of depositing an oxygen deficient metal composite film comprising at least two layers by chemical reaction of at least one precursor having a predetermined oxygen deficiency on a substrate, the method comprising:

during a metal oxide deposition cycle, exposing the substrate to a metal reactant gas comprising a metal and an oxygen reactant gas comprising oxygen to form a layer containing a metal oxide;

during an oxygen deficient deposition cycle, exposing the substrate to a reactant gas comprising a metal reactant gas and optionally a reactant gas excluding oxygen to form an oxygen deficient layer selected from one or more of a metal, a metal nitride, a metal carbonitride, a metal carbide, a metal oxynitride, a metal oxycarbonitride, a metal silicide, a nitrided metalsilicide (MSiN), a metal silicate, a nitride metal silicate (MSiON)) and combinations thereof, the oxygen deficient layer being oxygen deficient relative to the layer containing the metal oxide; and repeating the metal oxide deposition cycle and the oxygen deficient deposition cycle to form the oxygen deficient film having the predetermined oxygen deficiency;

wherein said method of deposition is selected from chemical vapor deposition and atomic layer deposition or a combination thereof, and wherein the composite film comprises one or more selected from $HfO_2/HfN$, $HfO_2/HfTiO$, $HfO_2/HfAl$, $Al_2O_3/Al_2O$, $ZrO_2/ZrO$, $TiO_2/TiO$, NiO/NiN, $Cu:MnO_x/Cu:MnO$, $Cu_xN$, $Cu:MoO_x/Cu:MoO$, Ln—Zn—O/Ln—Zn—N, $SrTiO_3/SrTiO$, Cr—$SrZrO_3$/Cr—SrZrO, $PrCaMnO_3/PrCaMnO$, $SrLaTiO_3/SrLaTiO$, $LaSrFeO_3/LaSrFeO$, $LaSrCoO_3/LaSrCoO$, $(Ba,Sr)TiO_3/(Ba,Sr)TiO$, $Hf(La)O_x$, $Hf(Ln)O_x$ and combinations thereof, and wherein Ln is a lanthanide.

2. The method of claim 1, comprising an additional reactant gas, wherein the additional reactant gas comprises one of nitrogen, ammonia, hydrogen, an alane, a hydrocarbon, and a silane.

3. The method of claim 1, wherein the oxygen deficient layer is deposited first, followed by depositing the layer containing a metal oxide, followed by depositing a second oxygen deficient layer.

4. The method of claim 1, wherein the metal reactant gas comprises at least one of a metal halide, metal amide, metal hydride, metal alkyl (where alkyl includes C1-C8 hydrocarbons, cyclepentadienyl, alkyl substituted cyclepentadienyl), metal alkoxide, metal beta diketonate, metal ketoiminate, metal amidinate, metal guanidinate, and a mixture thereof.

5. The method of claim 1, wherein the metal reactant comprises a metal halide.

6. The method of claim 1, wherein during the oxygen deficient deposition cycle, the substrate is exposed to a reactant gas excluding oxygen.

7. The method of claim 1, wherein the metal reactant gas comprises a metal chloride, and the oxygen reactant gas comprises $H_2O$, $O_2$, ozone, oxygen plasma, $H_2O_2$, NO, NOx, and $N_2O$.

8. The method of claim 1, wherein the metal reactant gas during the oxygen deficient deposition cycle comprises at least one of a metal amide and a metal chloride, and the reactant gas excluding oxygen comprises nitrogen.

9. The method of claim 1, wherein the reactant gas excluding oxygen comprises ammonia.

10. The method of claim 1, wherein the reactant gas excluding oxygen includes one of an alane and an aluminum hydrocarbon, silane, borane.

11. The method of claim 1, wherein the second layer comprises HfTiO and the second cycle comprises exposing the substrate to one or more of each $HfCl_4 Hf(NR_2)_4$ (where R=C1-C6 hydrocarbon), $Hf(OR)_4$, hafnium beta-diketonate, hafnium amidinate, hafnium guanidinate or heteroleptic ligand-metal complex thereof and $Ti(OPr)_4$, $Ti(NR_2)_4$ (where R=C1-C6 hydrocarbon), $TiCl_4$, titanium beta diketonate, titanium amidinate, titanium guanidinate, or hetroleptic ligand-metal complex thereof.

12. The method of claim 1, wherein the second layer comprises HfAl and the second cycle comprises exposing the substrate to $HfCl_4$ and one or more of alane, trimethyl aluminum, triethyl aluminum, dimethyl aluminum hydride, dimethylethylamine alane, triethylamine alane, trimethylamine alane and methylpyrrolidine alane.

13. The method of claim 1, wherein the composite film has a thickness up to about 500 Å.

14. A method of depositing an oxygen deficient metal film having a predetermined oxygen deficiency on a substrate, the method comprising:
(a) disposing a substrate within a processing chamber;
(b) performing a deposition process comprising:
(i) flowing $HfCl_4$ gas to at least a portion of the substrate within the chamber under conditions which form a partial monolayer on the substrate, the partial monolayer comprising Hafnium terminated with chlorine,
(ii) flowing a purge gas,
(iii) flowing water vapor to the substrate within the chamber under conditions which form a partial monolayer on the substrate, the partial monolayer comprising hafnium oxide and
(iv) flowing a purge gas;
(c) performing a second deposition process comprising:
(i) flowing $HfCl_4$ gas to at least a portion of the substrate within the chamber under conditions which form a partial monolayer comprising hafnium terminated with chlorine,
(ii) flowing a purge gas,
(iii) flowing $NH_3$ to the substrate within the chamber under conditions to form a partial monolayer comprising HfN, and
(iv) flowing a purge gas; and
(d) repeating (b) and (c);
wherein the deposition process is selected from chemical vapor deposition and atomic layer deposition or combinations thereof.

15. A method of depositing an oxygen deficient metal film having a predetermined oxygen deficiency on a substrate, wherein the substrate comprises TiN, the method comprising:
(a) performing a first deposition process comprising:
(i) flowing a Hf precursor to at least a portion of the substrate within the chamber under conditions which form a partial monolayer on the substrate, the partial monolayer comprising hafnium,
(ii) flowing a purge gas,
(b) performing a second deposition process comprising:
(i) flowing a Hf precursor to at least a portion of the substrate within the chamber under conditions which form a partial monolayer comprising hafnium,
(ii) flowing a purge gas,
(iii) flowing water vapor to the substrate within the chamber under conditions which form a partial monolayer on the substrate, the partial monolayer comprising hafnium oxide and
(iv) flowing a purge gas; and
(c) repeating (b) and (c);
wherein the deposition process is selected from chemical vapor deposition and atomic layer deposition or combinations thereof.

16. The method of claim 15, wherein the deposition process is selected from atomic layer deposition.

\* \* \* \* \*